(12) United States Patent
Sommerfeldt et al.

(10) Patent No.: US 9,089,917 B2
(45) Date of Patent: Jul. 28, 2015

(54) METHOD FOR CLOSING A HOUSING BY MEANS OF AN OPTICAL JOINING METHOD

(71) Applicant: Tesat-Spacecom GmbH & Co. KG, Backnang (DE)

(72) Inventors: Ralph Sommerfeldt, Backnang (DE); Eberhard Moess, Murrhardt (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 0 days.

(21) Appl. No.: 14/180,462

(22) Filed: Feb. 14, 2014

(65) Prior Publication Data

US 2014/0231060 A1    Aug. 21, 2014

(30) Foreign Application Priority Data

Feb. 18, 2013  (DE) .......................... 10 2013 002 628

(51) Int. Cl.
| | |
|---|---|
| B23K 1/005 | (2006.01) |
| B23K 26/20 | (2014.01) |
| H05K 5/06 | (2006.01) |
| H05K 7/20 | (2006.01) |

(52) U.S. Cl.
CPC .............. *B23K 1/0056* (2013.01); *B23K 26/20* (2013.01); *H05K 5/066* (2013.01); *H05K 7/2039* (2013.01); *H01L 2924/0002* (2013.01)

(58) Field of Classification Search
CPC .... B23K 1/0056; B23K 26/20; H05K 7/2039; H05K 5/066
See application file for complete search history.

(56) References Cited

U.S. PATENT DOCUMENTS

| | | | | |
|---|---|---|---|---|
| 4,400,870 A | * | 8/1983 | Islam | 219/121.64 |
| 4,547,624 A | * | 10/1985 | Tower et al. | 174/560 |
| 4,665,294 A | | 5/1987 | Hira et al. | |
| 4,713,520 A | * | 12/1987 | Van Nice et al. | 219/121.63 |
| 4,760,240 A | * | 7/1988 | Iikawa et al. | 219/121.64 |
| 2007/0199925 A1 | * | 8/2007 | Kigawa et al. | 219/121.64 |
| 2011/0185812 A1 | * | 8/2011 | Raschke | 73/431 |
| 2013/0323907 A1 | * | 12/2013 | Oosterhuis et al. | 438/460 |

FOREIGN PATENT DOCUMENTS

| | | | |
|---|---|---|---|
| JP | 58-223350 A | * | 12/1983 |
| JP | 5-243411 A | * | 9/1993 |
| WO | WO-2012/044160 A1 | * | 4/2012 |

OTHER PUBLICATIONS

Machine translation of Japan Patent Document No. 5-243,411, Jan. 2015.*

* cited by examiner

*Primary Examiner* — Geoffrey S Evans
(74) *Attorney, Agent, or Firm* — Crowell & Moring LLP

(57) ABSTRACT

A method for closing housing having first and second heat conductive housing elements, involves arranging a joining material between the housing elements. At least one of the housing elements is heated such that the joining material is conditioned for the joining of the housing elements. At least one of the housing elements has a localized reduction in the heat conductivity such that the dissipation of heat in the at least one housing element is reduced.

8 Claims, 3 Drawing Sheets

Figure 3:
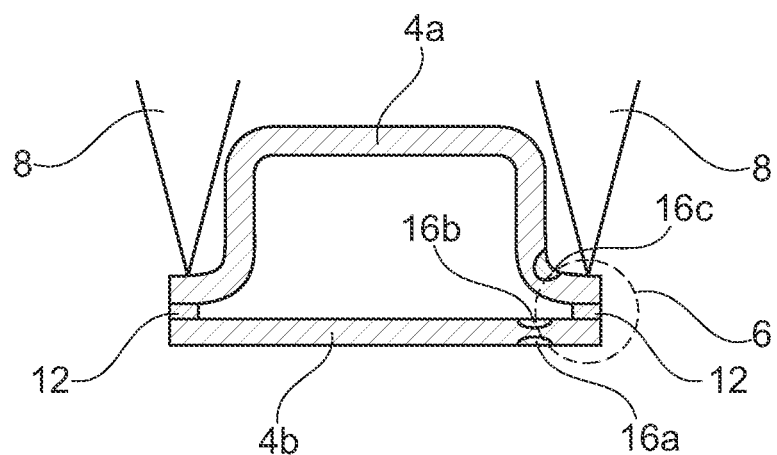

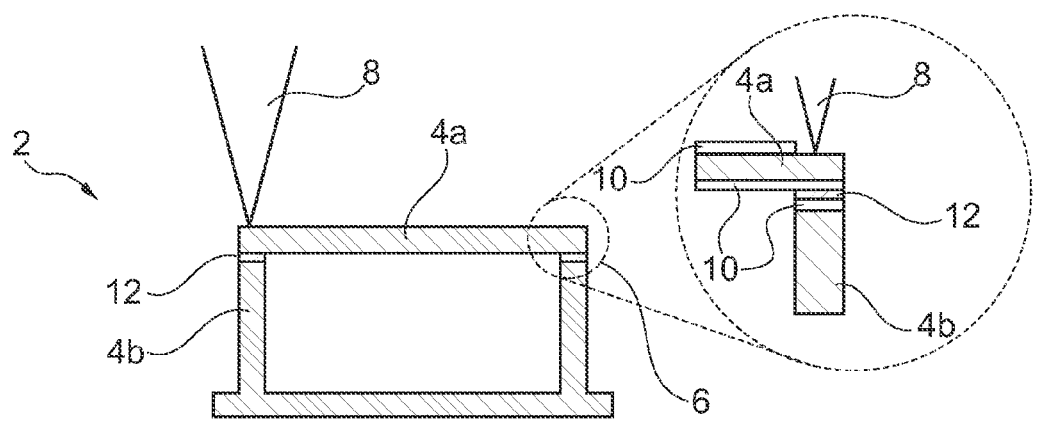
Fig. 1a, b
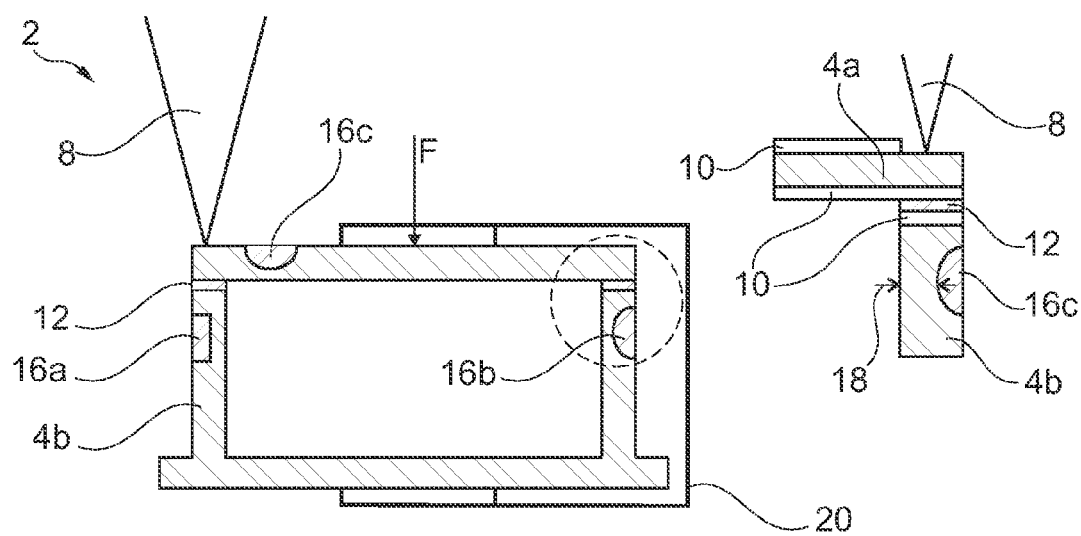
Fig. 2a, b

METHOD FOR CLOSING A HOUSING BY MEANS OF AN OPTICAL JOINING METHOD

CROSS REFERENCE TO RELATED APPLICATIONS

The present application claims priority under 35 U.S.C. §119 to German Patent Application No. 10 2013 002 628.8, filed Feb. 18, 2013, the entire disclosure of which is herein expressly incorporated by reference.

BACKGROUND AND SUMMARY OF THE INVENTION

The present invention relates to housing technology. In particular, the present invention relates to a housing and to a method for closing a housing by means of an optical joining method, such as laser welding, by way of example. In addition, the present invention also relates to a platform, particularly a satellite, having a housing according to the invention, as well as to the use of the method according to the invention for the purpose of manufacturing a housing.

Various different application scenarios are known, such as those in which electronic assemblies are arranged in a hermetically sealed housing in applications involving vacuums, high pressure, or low-pressure, by way of example. Suitable electrical conductors provide an electrical connection from the components arranged in the housing to the outside. Such hermetically sealed housings are used, by way of example, in satellite applications, including hybrid circuits and/or microwave modules or opto-electrical hybrid modules for satellite communication applications, for example.

A further aspect in this context is the hermetical closure of a housing after a circuit has been inserted into the housing. Suitable methods of closure include laser welding, oven soldering and/or reflow soldering, as well as resistance soldering and/or resistance welding, by way of example.

In the case of laser welding, the lid and the edge of the housing, of a housing, are heated very locally by the laser beam until the metal melts. Because the applied energy is comparably small at several Joules per weld point, the component is only subjected to a low heat load overall.

In oven soldering, the housing is heated together with the lid to a soldering temperature, such that a solder connection is formed between two metal surfaces. In this case, the component undergoes high thermal loading as a whole.

In resistance soldering and/or welding, energy in the form of a current is applied to the housing and/or housing elements using electrode rolls. With this type of contact, the transition resistance between an electrode and a housing element can vary greatly, thereby increasing the probability of local errors in the solder. The application of energy to the housing elements in the case of resistance soldering and/or welding is in the range between that of laser welding and oven soldering.

Whereas in the case of laser welding, it is possible to join a metal housing in a very hermetic manner, in the case of ceramic materials, the high pulse power of the laser pulse used, at several kW, can lead to cracks in the ceramic material.

According to the invention, both a housing and a method for closing a housing are disclosed in which the connection is created using an optical joining method such as a soldering process utilizing a laser, for example, and particularly an infrared laser, and in which the unrestricted dissipation of heat in the housing is limited by a local reduction in heat conductivity.

Accordingly, a housing, a method for closing a housing, a platform, particularly a satellite, having a housing according to the invention, and also the use of the method according to the invention for the purpose of manufacturing a housing are disclosed.

According to one exemplary embodiment of the present invention, a housing has a first housing element and a second housing element, wherein the housing elements have a heat conductive design, and wherein the housing elements can be joined by means of a joining process, wherein a joining material is configured between the first housing element and the second housing element for the purpose of joining the housing element, and wherein at least one of the housing elements can be heated such that the joining material is conditioned for the joining of the housing elements, wherein at least one of the housing elements has a local reduction in heat conductivity such that the dissipation of heat in the at least one housing element is reduced.

According to a further exemplary embodiment of the present invention, a method for closing a housing is disclosed, including the provision of a first housing element and the provision of a second housing element, wherein the housing elements have a heat conductive design, and wherein the housing elements can be joined by means of a joining process, the configuration of a joining material between the first housing element and the second housing element for the purpose of joining the housing elements, and the heating of at least one of the housing elements such that the joining material is conditioned for the joining of the housing elements, wherein at least one of the housing elements has a localized reduction in the heat conductivity thereof such that the dissipation of heat in the at least one housing element is reduced.

According to a further exemplary embodiment of the present invention, a platform is disclosed, particularly a satellite, having a housing according to the invention.

According to a further exemplary embodiment of the present invention, the method according to the invention is used for the production of a housing.

The continuing development of hybrid assemblies leads to housings which are ever-smaller, because—among other things—the electronic components accommodated in the same are undergoing a constantly-advancing miniaturization. A subsequent size reduction in the housing, in this case, places increasingly greater requirements on a closure method by means of which a housing is hermetically closed—for example by means of a cover element—because increased temperatures arise on and/or in the housing in smaller housings during the joining process by means of heating the joints and joining regions, and this can be problematic for the electronic components accommodated therein.

Particularly for housing elements made of a ceramic material, which has a comparably good ability to conduct heat, a comparably large amount of heat—for example from a cover element which is irradiated with laser light, and from a solder point positioned beneath the same—can flow into the ceramic housing, wherein this heat energy can then be transferred to electronic components in the housing.

For this reason, a joining process that is an alternative to a laser welding process is required in all housing components—for example ceramic housings—wherein a localized and/or average thermal load must be kept as minimal as possible. In addition, a housing may be required which at least reduces the transmission of heat energy in the housing during a joining process.

Such a novel housing, as well as such a novel joining method—for example designed as a laser soldering method—are provided by the present invention.

In the case of laser soldering, a joining material, for example a solder material, is melted between two housing elements. This may be carried out with a laser in the infrared wavelength region, by way of example, the laser applying its light to the upper side of a housing element—typically the cover element. By means of a quick scan and/or movement along a desired contour or joining seam of a housing element above the solder, sufficient energy is applied to the housing element in this case to liquefy a solder positioned in or on a housing element, and thereby melted. The joining material can subsequently suitably join the housing elements such that a hermetically sealed housing is formed. The housing element in this case can consist of a metal or ceramic material.

According to a further preferred embodiment of the present invention, at least one of the housing elements is constructed from a metal or a ceramic material, particularly a ceramic material with a metal coating. According to a further exemplary embodiment of the present invention, the housing can have a hermetically sealed construction following the completion of the joining process.

As a result of the transfer of heat by the solder to a housing edge surface of the housing element below, a solder joint is achieved which is particularly hermetically tight after it cools.

Pulsed laser soldering particularly constitutes a comparably very low thermal load for housing elements. However, this thermal load can be thermally critical for small and extremely small housings. For safety reasons, it is necessary to prevent the transmission of heat via the ceramic housing to components in the interior space. The term "transmission of heat" in this case particularly indicates the transfer of heat energy beyond the joint and/or solder seam into the housing, and to the components arranged therein. By means of suitable constructive measures, however, it is possible to prevent, and/or at least limit, the migration of heat into undesired regions of a housing, such that a housing remains relatively cool. In any case, the actual soldering time is significantly shorter than in an oven process—particularly because the heat transfer ends substantially instantaneously once the laser is switched off.

According to a further preferred embodiment of the present invention, a temperature barrier is included in at least one of the two housing elements, particularly at least in the housing element that is not heated, as a localized reduction of the heat conductivity thereof, wherein the temperature barrier can be designed as a localized reduction in the thickness and/or a localized cross-section narrowing of a housing wall.

In this case, temperature barriers that are suitable constructive measures are those which are included on ceramic walls of a housing element, by way of example, and particularly the housing element that is not irradiated by the laser. Such temperature barriers can be designed as localized reductions and/or constrictions of the thickness of a housing wall. In this way, the heat conductivity of a housing element is reduced, and particularly locally, such that the transfer of applied heat energy past these temperature barriers is delayed, and therefore is impeded. An additional advantage is that a heat energy bottleneck occurs in the region of a housing element that is arranged prior to the temperature barrier when viewed from the perspective of the laser, thereby favoring the heating of the region before the temperature barrier, by means of the applied laser energy.

According to a further exemplary embodiment of the present invention, the joining material is designed as a means found in the group consisting of solder, solder paste, solder wire, and solder preform, and particularly the joining material is free of fluxing agent.

If a solder joining process is mentioned in the field of aerospace applications, the term typically indicates soldering without fluxing agent. In a solder process that does not use fluxing agent, ideally no contaminants are formed needing to be removed following the joining process at great expense of time and effort.

For soldering processes without fluxing agent, the surfaces being joined must be wettable, meaning that there can neither be any visible contaminants, nor can the surface or the layer beneath the same be highly oxidized and/or contaminated with foreign atoms. The latter typically occurs when a housing element is stored improperly—for example in moist indoor air rather than in a dry nitrogen cabinet.

Contamination by foreign atoms in this case is difficult to demonstrate, and is generally only recognized during a soldering process when the solder material flows poorly, because the surface has poor wettability. In order to limit this, a joining process is typically carried out in a forming gas—a nitrogen/hydrogen mixture with 5-10% hydrogen, and in the worst case scenario, with 100% hydrogen. The hydrogen in this case has a reducing and/or oxygen-binding effect that is otherwise provided by a fluxing agent. The use of forming gas with a small fraction of hydrogen does not require any special safety precautions, while significant safety precautions must be made when pure hydrogen is used.

Laser soldering is a suitable method for reliably joining two electrical contacts to each other without thermally loading neighboring components. The joining material and/or solder can be applied to the joint position by an automatic solder wire feed, a suitably applied solder paste, or by a solder preform. Laser soldering is known, for example, in the assembly of electronic SMD circuit boards and/or in the assembly of heat-sensitive electronic assemblies, and in fully-automatic joining technology used in electromechanical components such as switches or motors, by way of example.

According to the invention, two housing elements are soldered, by their suitable surfaces, using a preferably fluxing agent-free joining material and/or solder, by means of an optical joining process such as laser soldering, by way of example. A laser beam is used for the purpose of heating the solder to the melting temperature, as well as heating the surfaces being joined—for example the housing edge and lid—to the soldering temperature. In this case, it is particularly preferred that metallic surfaces are joined to each other. However, as an alternative, the method according to the invention can also be carried out for housing elements made of a ceramic material.

According to a further preferred embodiment of the present invention, the heated housing element has a conditioned surface to facilitate the application of optical energy thereto; in particular, the surface of the housing element has a modified surface and/or an altered degree of reflection of the surface at least locally in the region in which the optical energy is applied.

Metallic surfaces in particular generally have a high degree of reflection, with the result that a significant fraction of incident laser light is reflected. One aspect of the present invention is the modification of a degree of reflection of a housing element surface. The surface near the solder joint can be modified in a targeted manner such that an acceptable absorption of the laser light can be achieved. A modification in this case can be that a surface plating, and therefore a coating of the housing surface that is commonly made of gold on nickel, is removed and/or the surface is roughened. For this as well, a suitable laser can be used which is able to execute an ablation of the surface. It is particularly preferred in this case that the same laser element is used as for the joining process—and potentially is controlled with modified parameters.

A modification of the surface in this case is not necessary over the entire housing element surface; the localized region of the solder joint is sufficient.

According to a further preferred embodiment of the present invention, at least one housing element is routed to a prespecified track during the application of the optical energy. According to a further preferred embodiment of the present invention, a laser element is included, both to condition the surface for the application of the optical energy to the same, and to apply the joining energy itself.

For the purpose of achieving an even heating of the surfaces being soldered, the heat energy can be applied to a housing element by means of a laser scanner, and therefore as a controllable laser beam, in a contactless manner, in the shape of the housing-lid contour. Such a housing-lid contour in this case substantially corresponds to the contour of the desired connection between the housing elements, and generally has a rectangular design—although other shapes can also be contemplated which are nonetheless based on a concrete housing construction. The laser light is absorbed by a surface of a housing element, which provides the conductance of the heat energy by the housing element to the joining material and/or solder. A further conductance of the heat energy by the solder to the second housing element being soldered enables the melting of the solder after a certain warm-up time, and therefore enables the production of a mechanically strong and hermetically sealed connection between the two housing elements, by means of the melted solder material.

It is particularly preferred that solders are used with no fluxing agent, such that it is not necessary to clean the housing elements following the joining process. So that it is possible to reliably use fluxing agent-free solders, an activation of the surface being soldered is generally necessary. An activation in this case can take place by baking the housing elements, typically a housing and a lid, in a vacuum oven, for example for the purpose of removing moisture by means of scrubbing with forming gas at elevated temperature, and optionally in combination with intermediate vacuum cycles. As an alternative, the joining process can be carried out using fluxing agent-free solder itself in forming gas and/or a nitrogen/hydrogen mixture.

According to a further preferred embodiment of the present invention, it is possible to further monitor the processing temperature when the two housing elements are joined, particularly by means of an IR camera and/or a temperature sensor.

To increase the reliability of the process, a so-called in-process control can be carried out during the solder process as part of the joining process. This can be realized, by way of example, by an infrared camera, an infrared temperature sensor, or another suitable temperature measurement which is substantially able to test whether the region in which the joining process will join the two housing elements has a suitable process temperature which will lead to the desired result.

According to a further preferred embodiment of the present invention, the two housing elements can be fixed to each other in their relative position during the joining process, by means of a fixing device, particularly a mechanical press device, a weight or a magnet system, and more particularly a self-centering magnet system.

In addition, a suitable mechanical fastening can be configured in a housing element, such that an upper solder partner, by way of example—which is typically a lid with a solder preform—does not float and shift its position on the melted and therefore fluid joining material during a solder process.

As such, a weight element, a magnet element, particularly a self-centering magnet, and/or a housing element that is a magnet element which is self-centering relative to the further housing element, can be configured on this housing element. In addition, a mechanical press device, particularly outside of the laser focus through which a laser beam must be guided, can press a housing element with a constant force against the further housing element, and/or hold down the same on said further housing element.

According to a further preferred embodiment of the present invention, the optical joining method can be designed as an optical soldering process, particularly a laser soldering process. According to a further preferred embodiment of the present invention, the joining process can be carried out using energy applied optically.

The joining process and/or laser solder process according to the invention has good reproducibility at high yields, and particularly demonstrates low thermo-mechanical stress in metallized ceramic housings. In laser soldering, heat energy is applied to a very limited local area by means of light, and therefore optically.

The provision of a suitable deflection device for the laser beam, for example a rapidly adjustable galvanic mirror in the kH range, enables a nearly arbitrary routing contour for the laser beam on a housing element, such that ideally only the region of the joining material and/or solder is fully heated as a whole, and liquefies essentially simultaneously.

BRIEF DESCRIPTION OF THE DRAWING FIGURES

Figure 4:
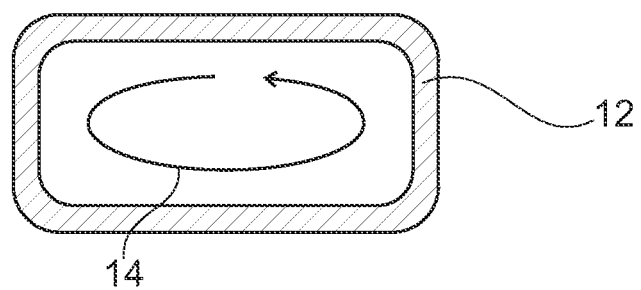
Figure 5:
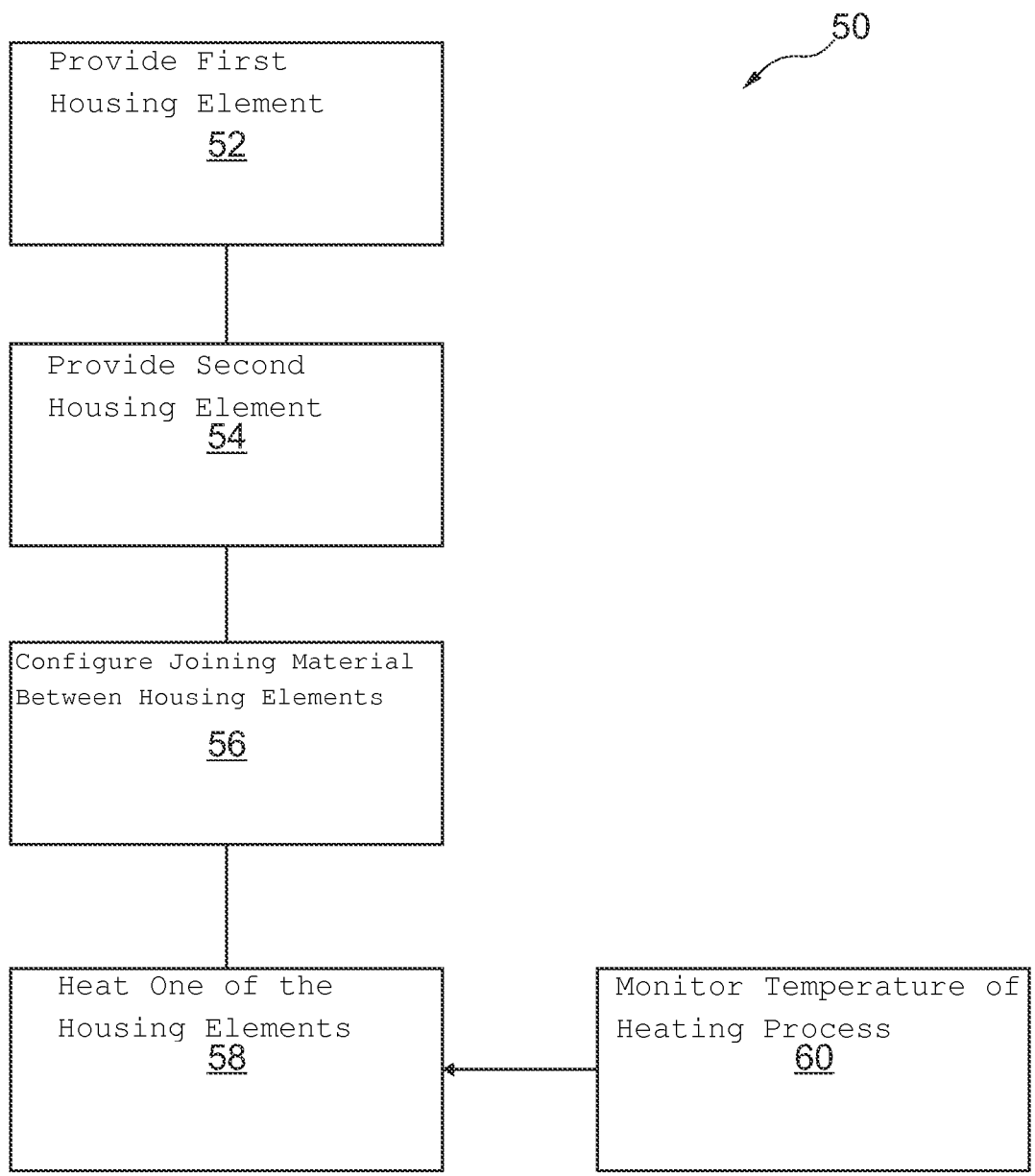

The present invention is described in greater detail below with reference to the attached illustration and in the context of embodiments thereof, wherein:

FIG. 1a, b shows an example of one embodiment of a housing according to the present invention;

FIG. 2a, b shows a further example of one embodiment of a housing according to the present invention, with temperature barriers; and FIG. 3 shows a further example of one embodiment of a housing according to the present invention;

FIG. 4 shows an example of one embodiment of a solder preform according to the present invention; and FIG. 5 shows an example of one embodiment of a method according to the invention for closing a housing by means of an optical joining method according to the present invention.

DETAILED DESCRIPTION

One example of an embodiment of a housing according to the present invention is illustrated below with reference to FIG. 1a, b.

FIG. 1a shows a schematic cross-section of a housing 2 according to the invention, consisting of a first housing element 4a, a cover element or lid, and a second housing element 4b and/or the base of the housing. FIG. 1b shows a detail enlargement of a contact region 6 between a first housing element and a second housing element 4a, b.

The housing 2 has an interior volume in which electronic components can be arranged in a suitable manner. After the first housing element 4a is joined to the second housing element 4b, the housing 2 can particularly be hermetically sealed.

The first housing element 4a is illustrated in an exemplary manner in FIGS. 1a, b as a flat, rectangular element, while the second housing element 4b has a substantially U-shaped cross-section and/or is designed with the shape of a pot. A joining material 12—for example a solder preform—is arranged between the first housing element 4a and the second housing element 4b. A laser beam 8 applies an optical energy input, by means of laser light, to the first housing element 4a. As such, the first housing element 4a is initially heated by means of the laser beam 8, and particularly only in the localized region 6 and/or at the joining site and/or the point of contact between the first and the second housing elements 4a, b. As a result of the localized heating, heat energy is also transferred to the joining material 12, which is conditioned as a result—for example, liquefied—and at the same time, energy is able to be transferred to the second housing element 4b. Due to the energy applied by means of the laser beam 8 in the localized joining region 6 of the housing elements 4a, b, the joining material 12 is consequently liquefied, and joins the first and the second housing elements 4a, b in a particularly hermetic manner, particularly following the cooling thereof.

One detailed embodiment of the localized joining region 6 is illustrated in FIG. 1b.

FIG. 1b shows that the first housing element 4a has a coating and/or a plating 10 of a suitable material—for example, gold—on both sides thereof. However, in the region in which the laser beam 8 acts on the first housing element 4a—at the least, on the side to which the laser beam 8 is applied—there is no such plating 10. The same has been excluded as part of the manufacture of the first housing element 4a, or has been removed prior to the joining process.

In particular, a laser beam 8, which is adjusted to be suitable for the purpose, and is potentially generated by the same laser element used for joining the housing halves, is used for the removal and/or ablation of the plating 10 in the joining region 6. The surface of the first housing element 4a can also be roughened in the region of the missing plating 10 in order to make the region therefore receive the optical energy of the laser beam 8 in an even further improved manner. The second housing element 4b likewise has a plating 10, particularly in the region in which the joining material 12 is also arranged.

The first and second housing elements 4a, b can be constructed from a ceramic material, by way of example, while the plating 10 is constructed of a metal, particularly gold. The joining material 12 can therefore be joined to the metallic plating 10 preferably by means of the joining process according to the invention.

A further example of an embodiment of a housing according to the present invention, having temperature barriers, is illustrated below with reference to FIGS. 2a, b.

Here, FIGS. 2a, b correspond to the illustration in FIGS. 1a, b, except that the first and/or the second housing elements 4a, b have temperature barriers 16a, b, c which are designed, by way of example, as a cross-section narrowing 18 in the thickness of the wall of the housing elements 4a, b.

The temperature barrier 16a in this case has a substantially rectangular cross-section, while the temperature barrier 16b has an arc-shaped cross-section and/or a circular recess in the material of the second housing element 4b. Such a temperature barrier 16a, b, c impedes and/or reduces the dissipation of heat from one side of the temperature barrier 16 to the other side—for example, from a side which is oriented toward the laser to a side which faces away from the laser. As a result of such a temperature barrier, an increased volume of energy in the material remains on the side oriented toward the laser, thereby producing a localized temperature that is higher than a temperature without the temperature barrier. This also enables the use of lower laser energy while still obtaining the same result of the joining process.

The first housing element 4a likewise has a temperature barrier 16c designed with a circular shape, by way of example. The embodiment of the shape of a temperature barrier 16a, b, c in this case is the result of the manufacturing process used for the recess, and particularly the tools used therefore.

The temperature barrier 16 is preferably configured around the full circumference of a housing element, and thereby bounds off the joining region 6 from the rest of the housing element. In this way, the energy applied to the region of the housing element that is oriented toward the laser is concentrated. The cross-section narrowing 18 of the housing wall of the second housing element 4b is illustrated in an exemplary manner in FIG. 2b.

A fixing device 20, which an exemplary design is likewise illustrated in a schematic manner; it suitably fixes the first housing element 4a and the second housing element 4b relative to each other, and therefore arranges the same during the joining process. Particularly when the joining material 12 liquefies, the fixing device 20 prevents the housing elements 4a, b from slipping relative to each other. As an alternative, at least one housing element—as an example, the first housing element 4a in FIG. 2a—can have a weight force F applied to it by means of a weight, which also prevents a sliding and/or a relative change in position of the housing elements 4a, b with respect to each other.

One example of an embodiment of a housing according to the present invention is illustrated below with reference to FIG. 3.

FIG. 3 shows a somewhat different housing cross-section, having a second housing element 4b which is substantially rectangular and/or flat in shape, as well as a bell-shaped housing element 4a. The housing elements in FIG. 3 can have a comparable design to that of the housing elements in FIGS. 1b and/or 2b in the localized joining region 6 between the first and the second housing elements 4a, b, which is not further illustrated in FIG. 3. As such, the housing elements can have a plating that is removed in the region in which the laser beam 8 strikes the first housing element 4a.

A laser 8 heats the first housing element 4a in FIG. 3 in the joining region 6, and as a result, the two housing elements 4a, b can in turn be joined by means of the laser soldering method according to the invention, particularly in a hermetic manner.

In addition, temperature barriers 16a, b, c are also illustrated in FIG. 3, wherein the second housing element 4b has a constriction on both sides thereof, by way of example, as a temperature barrier 16a, b, and wherein the first housing element 4a in turn has a single-side constriction 16c, by way of example.

When a suitable laser 8 is used, temperature barriers 16a, b, c can also be created directly in the material of the housing elements 4a, b prior to the actual joining process, and preferably by means of the same laser element 8 as is used for the joining process and/or the ablation of the plating 10.

One example of an embodiment of a solder preform according to the present invention is illustrated below with reference to FIG. 4.

FIG. 4 shows one exemplary top view of a joining material 12 designed as a solder preform. The solder preform in this case can be a stamped element consisting entirely of the joining material 12. As a result of the joining material 12 being a single piece, the same is easy to manipulate, and can be arranged between a first and a second housing element 4a, b in a particularly simple manner. The circular track 14 indicated in the interior of the solder preform 12 constitutes a possible peripheral path of a laser beam around the joining region 6, between the first and the second housing elements 4a, b—and therefore, the path of the laser 14. As such, a substantially continuous, circular and/or rectangular track movement of the laser beam 8 on the first housing element 4a in the joining region 6 enables an even heating of the first housing element 4a, the solder preform 12, and the second housing element 4b, such that the joining process—for example a laser soldering process—is realized at all points of the joining region 6, substantially at the same time.

A further example of one embodiment of a method according to the invention for closing a housing by means of an optical joining method according to the present invention is illustrated in FIG. 5.

FIG. 5 shows a method 50 for closing a housing 2, including the provision 52 of a first housing element 4a and the provision 54 of a second housing element 4b, wherein the housing elements 4a, b have a heat conductive design, and wherein the housing elements 4a, b can be joined by means of a joining process; the configuration 56 of a joining material 12 between the first housing element 4a and the second housing element 4b for the purpose of joining the housing elements 4a, b, and the heating 58 of one of the housing elements 4a, b such that the joining material 12 is conditioned for the joining of the housing elements 4a, b, wherein at least one of the housing elements 4a, b has a localized reduction in the heat conductivity thereof such that the dissipation of heat in the at least one housing element 4a, b is reduced. The temperature of the heating process can be monitored 60.

In addition, it is hereby noted that the terms "has/have" and/or "include" do not exclude any other elements or steps, and that "one" and/or "a/an" do not exclude any number. Furthermore, it is hereby noted that features or steps which have been described in reference to one of the above embodiments can also be used in combination with other features or steps of other embodiments described above. Reference numbers in the claims are not intended as restrictions.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF REFERENCE NUMBERS 2 housing
4a, b first, second housing elements
6 joining region, local
8 laser element/laser beam
10 coating/plating
12 joining material/solder preform
14 laser beam path
16a, b, c temperature barrier
18 cross-section narrowing
20 fixing device/press device
50 Method for closing a housing
52 Provision of a first housing element
54 Provision of a second housing element
56 Configuration of a joining material
58 Heating of a housing element
60 Monitoring of the processing temperature

What is claimed is:

1. A method for closing a housing, the method comprising:
   providing a first housing element;
   providing a second housing element, wherein the first and second housing elements are heat conductive;
   arranging a joining material between the first housing element and the second housing element; and
   heating of at least one of the housing elements such that the joining material is conditioned to join the first and second housing elements;
   wherein at least one of the housing elements has a local reduction in heat conductivity such that the dissipation of heat in the at least one housing element is reduced.

2. The method of claim 1, wherein the heating is performed using an optical soldering method.

3. The method of claim 1, wherein the heating is performed using a laser soldering method.

4. The method according to claim 1, wherein the at least one housing element is routed to a prespecified track during the application of the optical energy.

5. The method according to claim 1, further comprising:
   monitoring a processing temperature when the two housing elements are joined using an IR camera or a temperature sensor.

6. The method according to claim 1, wherein the first and second housing elements are fixed to each other in their relative position during the joining process, by means of a fixing device, wherein the fixing device is one of a mechanical press device, a weight, a magnet system, and a self-centering magnet system.

7. The method according to claim 1, wherein the heating is performed by applying optical energy.

8. The method according to claim 7, wherein a laser element conditions a surface for application of the optical energy to the surface and applies the joining energy.

* * * * *